(12) United States Patent
Thimsen et al.

(10) Patent No.: US 8,741,386 B2
(45) Date of Patent: Jun. 3, 2014

(54) ATOMIC LAYER DEPOSITION OF QUATERNARY CHALCOGENIDES

(71) Applicants: Elijah J. Thimsen, Chicago, IL (US); Shannon C. Riha, Park Ridge, IL (US); Alex B. F. Martinson, Woodridge, IL (US); Jeffrey W. Elam, Elmhurst, IL (US); Michael J. Pellin, Naperville, IL (US)

(72) Inventors: Elijah J. Thimsen, Chicago, IL (US); Shannon C. Riha, Park Ridge, IL (US); Alex B. F. Martinson, Woodridge, IL (US); Jeffrey W. Elam, Elmhurst, IL (US); Michael J. Pellin, Naperville, IL (US)

(73) Assignee: Uchicago Argonne, LLC, Chicago, IL (US)

( * ) Notice: Subject to any disclaimer, the term of this patent is extended or adjusted under 35 U.S.C. 154(b) by 55 days.

(21) Appl. No.: 13/631,135

(22) Filed: Sep. 28, 2012

(65) Prior Publication Data

US 2014/0093645 A1     Apr. 3, 2014

(51) Int. Cl.
*C23C 16/00*     (2006.01)
(52) U.S. Cl.
USPC ................ 427/255.7; 427/248.1; 427/255.31

(58) Field of Classification Search
None
See application file for complete search history.

(56) References Cited

U.S. PATENT DOCUMENTS

| | | |
|---|---|---|
| 2009/0314342 A1 | 12/2009 | Bent et al. |
| 2010/0248419 A1 | 9/2010 | Woodruff et al. |
| 2011/0294254 A1 | 12/2011 | Jackrel et al. |

FOREIGN PATENT DOCUMENTS

WO    WO 2011/065994    6/2011

OTHER PUBLICATIONS

Thimsen, Chemistry of Materials, Aug. 9, 2012, p. 3188.*
Price, Chem. Mater., 1999, V114, p. 1792.*
Barone, Jo Materials Chem, Nov. 2000, p. 464.*
Kim, J Phys Chem C, 2010, 114, p. 17597.*
Sinsermsuksakul, Adv Engery Materials, 2011, p. 1116.*
Thimsen et al., *Atomic Layer Deposition of the Quatemary Chalcogenide $Cu_2ZnSnS_4$*, ACS Paragon Plus Environment, pp. 10-11, Chemistry of Materials, 2012.

* cited by examiner

*Primary Examiner* — Joseph Miller, Jr.
(74) *Attorney, Agent, or Firm* — Foley & Lardner LLP

(57) ABSTRACT

Methods and systems are provided for synthesis and deposition of chalcogenides (including $Cu_2ZnSnS_4$). Binary compounds, such as metal sulfides, can be deposited by alternating exposures of the substrate to a metal cation precursor and a chalcogen anion precursor with purge steps between.

18 Claims, 12 Drawing Sheets

ATOMIC LAYER DEPOSITION OF QUATERNARY CHALCOGENIDES

STATEMENT OF GOVERNMENT INTEREST

The United States Government has rights in the invention described herein pursuant to Contract No. DE-AC02-06CH11357 between the United States Department of Energy and UChicago Argonne, LLC, as operator of Argonne National Laboratory.

FIELD OF THE INVENTION

The present invention generally relates to methods and systems for synthesis and deposition of chalcogenides (including $Cu_2ZnSnS_4$). Specifically, embodiments of the present invention relate conformal metal sulfide thin film deposition.

BACKGROUND OF THE INVENTION

Atomic layer deposition (ALD) is a layer-by-layer synthesis method capable of depositing conformal thin films with thickness and compositional control on sub-nanometer length scales. ALD is emerging as the premier thin film deposition method to synthesize conformal layers with control over composition and thickness at the angstrom to nanometer length scale. ALD syntheses operate by alternating exposures to complimentary chemical precursor vapors. In the ALD window, each of these precursors reacts with the surface sequentially in a self-limiting fashion to deposit one monolayer or less.

Due to the self-limiting nature of the complimentary surface reactions, conformal pinhole-free films can be deposited on nanostructured surfaces with very high aspect ratios (>1000). See, e.g., Hamann, T. W.; Martinson, A. B. F.; Elam, J. W.; Pellin, M. J.; Hupp, J. T. *J. Phys. Chem. C* 2008, 112, 10303-10307; see also, Martinson, A. B. F.; Elam, J. W.; Liu, J.; Pellin, M. J.; Marks, T. J.; Hupp, J. T. *Nano. Lett.* 2008, 8, 2862-2866, both incorporated by reference herein. For photovoltaic solar energy conversion, the unique capabilities of ALD could enable next-generation high efficiency nanostructured devices. One example is plasmon enhancement, which can increase the open-circuit photopotential, see, e.g., Martinson, A. B. F.; Giebink, N. C.; Wiederrecht, G. P.; Rosenmann, D.; Wasielewski, M. R. *Energ. Environ. Sci.* 2011, 4, incorporated herein by reference, by for example, concentrating photoexcited charge carriers. See, e.g., Warren, S. C.; Thimsen, E. *Energ. Environ. Sci.* 2012, 5, 5133-5146, incorporated herein by reference. Absorption enhancements based on the localized surface Plasmon resonance (LSPR) are highly localized to within approximately 10 nm of the metal nanoparticle surface, see, e.g., Hagglund, C.; Apell, S. P.; Kasemo, B. *Nano. Lett.* v2010, 10, 3135-3141; Thimsen, E. *Chem. Mater.* 2011, 23, 4612-4617; Standridge, S. D.; Schatz, G. C.; Hupp, J. T. *J. Am, Chem. Soc.* 2009, 131, 8407-8409 incorporated herein by reference, and so conformal absorber layers must be synthesized on the rough substrate at this length scale—a challenging task ideally suited for ALD. Another example where ALD can contribute to improved photovoltaic performance is through minority carrier collection. For semiconductors, in general, the minority carrier collection distance is often incommensurate with the light absorption depth, limiting conversion efficiencies in planar configurations—especially at wavelengths near the band gap for materials with short-lived, low-mobility photoexcited charge carriers.

ALD allows one, in principle, to decouple light absorption from photoexcited charge carrier collection using interpenetrating device geometries. This concept of decoupling light absorption from photoexcited charge carrier (excitons or minority carriers) collection has been proposed in various forms over the years; some classic examples are the dye-sensitized solar cell (DSC), bulk-heterojunction (BHJ) solar cell and extremely thin absorber (ETA) solar cells. The scalable fabrication of a thin absorber layer that exhibits high internal quantum efficiency from earth-abundant, low cost components remains a central challenge to fully realizing the nanostructured device designs.

While many materials have been synthesized by ALD, the technologically-important metal sulfides are underexplored, and homogenous quaternary metal sulfides are absent from the literature.

Compared to metal oxides, metal sulfides have received relatively little attention from the ALD community. Self-limiting chemistry often proceeds readily using $H_2S$ as the sulfur source. Beyond binary and ternary metal-sulfides, to the best of our knowledge, there are no examples in the published literature for the synthesis of quaternary sulfides by ALD. $Cu_2ZnSnS_4$ (CZTS) is an absorber layer that has attracted attention recently for solar energy conversion because of its band gap ($E_g \approx 1.4$ eV), the relative abundance and low cost of its constituent elements, and its demonstrated solar-to-electricity power conversion efficiencies over 8%.11. In CZTS the oxidation states are Cu(+I), Zn(+II), Sn(+IV) and S(-II). Control over composition in this system is important. CZTS compositions in the best devices are Cu-poor and Zn-rich. For example, the 8.4% efficient CZTS device reported by Shin et al. had a Cu/Sn ratio from 1.7 to 1.8, and a Zn/Sn ratio from 1.2 to 1.3.11. It has been proposed that this empirical observation could be a result of the dominant acceptor defect, which is expected to change with composition. In stoichiometric CZTS, the lowest energy acceptor defect has been reported to be the $Cu_{Zn}$ antisite (i.e. $Cu^+$ sitting on a $Zn^{2+}$ site), which has a relatively deep acceptor level of 0.12 eV above the valence band maximum. The higher energy Cu+ vacancy defect is more attractive because of its shallower level, only 0.02 eV above the valence band maximum.

The hypothesis is that the Cu-poor, Zn-rich CZTS favors the formation of the Cu vacancy defect and suppresses the $Cu_{Zn}$ antisite, thereby improving performance. While the hypothesis regarding the role of the dominant acceptor defect in performance remains experimentally untested, the empirical observation of the composition correlation stands. It is clear that a given synthesis process for CZTS must demonstrate control over composition. Even while CZTS devices have exhibited very promising performance, the best devices still have low open-circuit voltages compared to the band gap ($V_{oc} \approx 0.66$ V; $E_g \approx 1.4$ eV). They also have relatively low quantum efficiencies at wavelengths near the band gap transition (900 nm), as well as below 500 nm where parasitic absorption by the window layers becomes important. The published short circuit photocurrent densities in the highest efficiency CZTS photovoltaic solar cells are approximately 20 mA $cm^{-2}$, 11 well below the theoretical maximum of 33 mA $cm^{-2}$ under AM1.5 illumination, leaving room for improvement.

Many synthesis routes to CZTS have been explored. The most common ways to fabricate devices of reasonable efficiency are physical vapor deposition of metal or binary sulfide stacks followed by sulfurization; or solution-phase nanoparticle synthesis followed by deposition onto a substrate and annealing. For physical vapor deposition, a common route is to thermally evaporate metal films (e.g. Cu, Zn and Sn) onto a substrate, and then anneal the metal film stack in a sulfur atmosphere at T>500° C. to generate CZTS. One can also do the same procedure using binary metal sulfide film stacks (e.g. CuS, SnS and ZnS). For nanoparticles, they must be deposited on the substrate by for example, spreading or dip-coating. Like the metal film stacks, nanoparticle deposition is typically followed by annealing in a some type of chalcogen-containing atmosphere to obtain efficient solar cells.

SUMMARY OF THE INVENTION

One embodiment of the invention relates to a method of synthesizing a $Cu_2ZnSnS_4$ conformal layer. A $Cu_2S$ layer is deposited. A $SnS_2$ layer is deposited on the $Cu_2S$ layer. A ZnS layer is deposited on the $SnS_2$ layer. $Cu_2ZnSnS_4$ is formed from the $Cu_2S$ layer, the ZnS layer, and the $SnS_2$ layer.

In one embodiment, the present invention relates to a method of synthesizing a $Cu_2ZnSnS_4$ conformal layer. The method comprises creating N $Cu_2S/SnS_2/ZnS$ stacks by: depositing via X cycles of atomic layer deposition $Cu_2S$; depositing via Y cycles of atomic layer deposition $SnS_2$; and depositing via Z cycles of atomic layer deposition ZnS.

In one embodiment, the present invention relates to a method of synthesizing quaternary chalcogenides. N first sulfide/second sulfide/third sulfide stacks by created by depositing, via x cycles of atomic layer deposition, a first sulfide layer; depositing, via y cycles of atomic layer deposition, a second sulfide layer; and depositing, via z cycles of atomic layer deposition, a third sulfide layer.

In one embodiment, the present invention relates to a method of depositing $SnS_2$ on a substrate. The substrate is exposed to tetrakis(dimethylamido)Sn(IV) for about 1 second. Then the material is purged for about 20 seconds with an inert gas. The substrate is exposed to $H_2S$ for about 1s. Then the material is purged for about 20 seconds with nitrogen.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The foregoing and other objects, aspects, features, and advantages of the disclosure will become more apparent and better understood by referring to the following description taken in conjunction with the accompanying drawings, in which.

DETAILED DESCRIPTION OF THE PREFERRED EMBODIMENTS

Figure 1:
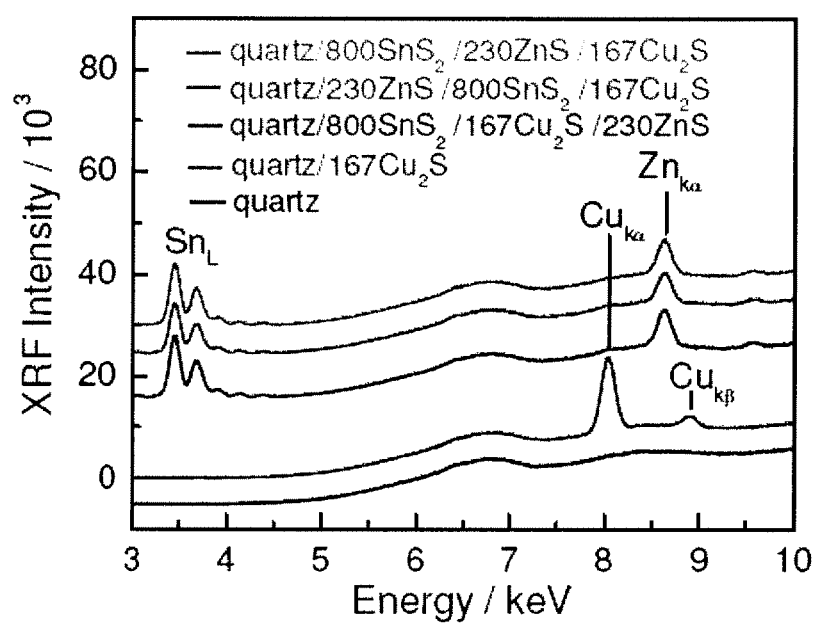
FIG. 1 is an XRF spectra for trilayer sequences (a), (b) and (c). The $Cu_2S$ and quartz controls are included for reference. The plots have been offset for clarity.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Methods and systems are provided for synthesis and deposition of chalcogenides (including $Cu_2ZnSnS_4$). Binary compounds, such as metal sulfides (e.g. ZnS), can be deposited by alternating exposures of the substrate to a metal cation precursor (e.g. diethyl zinc) and a chalcogen anion precursor (e.g. H$_2$S) with purge steps between. Certain implementations relate to an ALD process to synthesize a metal sulfide. Specifically, one embodiment relates to synthesis of Cu$_2$ZnSnS$_4$ (CZTS), a potentially low cost semiconductor being explored for photovoltaic applications. Implementations of the invention may be utilized for, but are not limited to, the synthesis and deposition of complex chalcogenides such as:

Cu$_2$ZnSnS$_4$
CuZn(Sn$_x$,Ge$_{(1-x)}$)(S$_y$,Se$_{(1-y)}$)$_4$
Cu(In$_x$,Ga$_{(1-x)}$)(S$_y$,S$_{(1-y)}$)$_2$
Bi$_2$Te$_2$Se,
Bi$_2$Te$_2$S and
SnBi$_2$Te$_4$.

Two embodiments are further described herein: (1) one in which a trilayer stack of binary metal sulfides (i.e. Cu$_2$S, SnS$_2$ and ZnS) is deposited and mixed by thermal annealing and (2) a supercycle strategy. Both routes rely on the facile solid state diffusion of chalcogenides for mixing. For this ALD route to the CZTS system, the challenges are nucleation, ion-exchange between the film and the volatile chemical precursors, and phase stability of binary SnS$_2$. The CZTS thin films were made with no sulfurization step and appeared phase-pure by x-ray diffraction and Raman spectroscopy. X-ray fluorescence measurements revealed that the films contained the expected amount of sulfur based on the target oxidation states. Photoelectrochemical measurements under simulated AM1.5 illumination using Eu$^{+3}$ as an electron acceptor demonstrated that the films were photoactive and had an average internal quantum efficiency (IQE) of 12%.

For exemplary embodiments using a "trilayer" strategy, the method involves depositing a stack of 3 binary metal sulfides (i.e. Cu$_2$S, ZnS and SnS$_2$) and then mixing by a post-deposition heat treatment in argon. In one implementation, the trilayer strategy works by depositing thick (order 10 nm) layers of binary sulfides and then mixing them by thermal annealing. In various embodiments the number of cycles for deposition of each component is greater than or equal to one. The number of cycles and the thickness of the layers may various in implentations from 1 cycle or about 1 Angstrom to 1000's of cycles or grater than 100s of nanometers in thickness For the trilayer strategy, the notation "substrate/xCu$_2$S/ySnS$_2$/zZnS" is used to describe a trilayer stack consisting of x cycles of Cu$_2$S deposited on the substrate, followed by y cycles of SnS$_2$ and z cycles of ZnS. Using this sequence, the metals were deposited in their target oxidation states and their ratios could be controlled through the cycle ratios. After annealing, the example films tested exhibit Raman scattering spectra, XRD spectra, and an absorption coefficient consistent with CZTS. For the tested examples, CZTS was photoactive by PEC measurements, and exhibited an internal quantum efficiency of approximately 12% at −0.6 V vs. Ag/AgCl under simulated AM1.5 illumination for photoreduction of Eu(+III).

For exemplary embodiments using a "supercycle" strategy, the method involves cycles of binary metal sulfides and is repeated many times to form the film. For the supercycle strategy, the notation "substrate/n(xCu$_2$S/ySnS$_2$/zZnS)" means that a sequence of x cycles of Cu$_2$S followed by y cycles of SnS$_2$ and z cycles of ZnS was repeated n times to form the film. In various implementations the number of cycles for each deposition in the sequence, the x, y, and z of the above nomenclature is at least one and the number of sequences, n in the above nomenclature, is at least two. The cycle ratios can be tuned to control composition. Photoelectrochemical (PEC) characterization of the films revealed that they were photoactive. Although the examples included herein provide evidence of photoactivity, it should be understood that the photoactivity can be optimized or a complete all-solid state device can be fabricated. The supercycle strategy is promising for synthesizing crystalline CZTS as deposited, but it has been observed that the rule of mixtures does not apply. It is believed that the nucleation behavior must first be mapped out in detail to optimize the composition.

In one aspect, the general process for synthesis of the chalcogenides may be viewed as for order f=n(xCu$_2$S/ySnS$_2$/zZnS) wherein n is the number of times the parenthetical process is repeated and the process in the parenthesis is x cycles of Cu$_2$S, followed by y cycles of SnS$_2$ and then z cycle of ZnS. The trilayer strategy is a special case where n=1. The supercycle strategy is when n>1.

Experimental Procedures

Experimental results are hereinafter presented regarding embodiments utilizing the trilayer strategy and the supercycle strategy. It should be appreciated that such embodiments are provided as illustration and are not intended to limit the scope of the invention.

Atomic layer deposition was performed in a Savannah S200 (Cambridge Nanotech, Cambridge Mass.) customized for compatibility with H$_2$S. The reactor was integrated with a glove box, although it is not believed that this is required for the results presented herein. For all depositions, the hot-wall chamber temperature was 135° C. The high-purity nitrogen flow rate was 10 sccm and deposition was carried out in pulse mode (continuous flow). Under nitrogen flow with no precursor pulsing, the chamber pressure was approximately 0.5 torr. For all materials, the sulfide source was 1% H$_2$S balance N$_2$. The H$_2$S was delivered to the precursor manifold through a 0.3 mm orifice (Lennox Laser) that was placed just upstream of the pneumatic ALD valve. The delivery pressure from the corrosive gas regulator was −18 inches of mercury gauge pressure.

The substrates used were either fused silica (quartz), fluorine-doped SnO$_2$-coated glass (TEC 15, Pilkington Glass), or polished silicon. The SnO$_2$-coated glass is abbreviated as FTO. Cu$_2$S was deposited as previously published and adapted for use on the Savannah S200. (See, e.g., Thimsen, E.; Peng, Q.; Martinson, A. B. F.; Pellin, M. J.; Elam, J. W. Chem. Mater. 2011, 23, 4411-4413, incorporated herein by reference.) The precursor for Cu$^+$ was bis(N,N'-disec-butylacetamidinato)dicopper(I) (Strem Chemicals), which is abbreviated as Cu$_2$ DBA. The Cu$_2$ DBA precursor reservoir was kept at 160° C. The vapor was fed into the chamber using a nitrogen-assisted vapor delivery system. The procedure to dose the Cu$_2$ DBA was to repeat the following steps 5 times: pressurize Cu$_2$ DBA cylinder for 0.015 seconds using nitrogen at 25 psia, wait 1.0 second for the nitrogen to equilibrate and the precursor to mix, pulse the nitrogen/Cu$_2$ DBA mixture into the chamber. One cycle of Cu$_2$S was completed by first dosing Cu$_2$ DBA, followed by a 10 second purge, 1.0 second H$_2$S dose, finishing with a 10 second purge.

While two groups have reported on the ALD synthesis of SnS using Sn(II) precursors, a process for SnS$_2$ has not been reported. The present invention therefore utilizes a new process. One cycle of SnS$_2$ means a 1.0 second pulse of tetrakis (dimethylamido)Sn(IV) (SnTDMA, Sigma-Aldrich), followed by a 20.0 second nitrogen purge, followed by a 1.0 second H$_2$S dose, finishing with a 20.0 second nitrogen purge. The temperature of the SnTDMA reservoir was maintained at 55° C. The vapor pressure of the SnTDMA at this temperature was sufficient to feed the chemical from the cylinder to the chamber with no assistance.

For ZnS, the well-known process employing diethyl zinc (DEZ, Sigma-Aldrich) and $H_2S$ was used. The diethyl zinc was kept at room temperature. One cycle of ZnS consisted of a 0.015 second pulse of DEZ, followed by a 20.0 second purge, followed by a 1.0 second $H_2S$ pulse, finishing with a 20.0 second purge.

Select films were annealed under argon in a tube furnace of 1" internal diameter. The flow rate of argon was 0.33 lpm. The temperature was ramped up to the set point over a period of 50 minutes, allowed to soak for the specified time, and then cooled at the natural rate of the system back to below 150° C. before sample removal. The cooling step took approximately 30 minutes.

X-ray fluorescence (XRF, ED2000, Oxford Instruments) was used to quantify composition. Calculations were performed using the Berkeley Lab X-Ray Interactions With Matter tool to verify that XRF measurements were performed in the thin film limit using a fixed angle of 45 in the energy range from 2 to 10 keV. All samples had a thickness<10% of the attenuation length and a X-ray transmission>90% in the energy range of interest. Samples for XRF were deposited on fused silica (quartz) to minimize interference from substrate impurities. The XRF standards were a 40.7 nm Cu metal film for [Cu], 40.7 nm Sn metal film for [Sn], and 22 nm ZnS film for [Zn] and [S]. Raman spectroscopy was performed using a Renishaw Ramascope spectrometer with a 633 nm laser. Raman spectroscopy was performed on samples deposited on both quartz and FTO. The substrate did not have an apparent effect on the Raman scattering spectra. X-ray diffraction (XRD, Rigaku minflex) was carried out in θ-2θ mode on samples deposited on quartz. Cross-section scanning electron microscope (SEM) images were taken in a Hitachi S4500-II. The substrate was quartz and the samples were coated with a thin layer<10 nm of Au to prevent charging. X-ray photoelectron spectroscopy (XPS) was performed in a custom instrument as described in Zinovev, A. V.; Moore, J. F.; Hryn, J.; Pellin, M. J. *Surface Science* 2006, 600, 2242-2251. incorporated herein by reference. Spectra were recorded using an MgKα (1253.6 eV) source for excitation and a hemispherical electron energy analyzer in the fixed absolute resolution mode with a pass energy of 44 eV for survey spectra, and 22 eV for detailed measurements of specific peaks, when needed. Survey spectra were acquired using an energy step of 0.5 eV. The spectrometer calibration was performed using the gold XPS emission line (Au 4f7/2 with binding energy 84.0 eV). The residual vacuum in the analyzing chamber was ~1×10$^{-9}$ ton. The electrons were collected from an elliptical area of approximately 3×4 mm$^2$ in the central part of a 1×1 cm$^2$ sample.

In this setup the collection depth was from 1 to 3 nm into the film. Processing of the obtained XPS spectra was performed using CasaXPS (Copyright ©2009 Casa Software Ltd.). All measured peaks used for quantification were corrected for inelastic scattering by first subtracting the Shirley background from the raw spectra, followed by fitting of the peaks using asymmetric pseudo-Voigt peaks with different relative content of Gaussian and Lorentzian components that were optimized for the best fit. PEC measurements were carried out in a 3-electrode configuration using an Ag/AgCl in saturated KCl reference electrode. The electrolyte was 0.1M Eu(+III)(NO$_3$)$_3$ in a supporting electrolyte of 1M KCl. The active area on the photoelectrode was 1.7 cm$^2$. The sample was illuminated using a 300 W arc lamp equipped with an AM1.5 and ultra-violet (UV) filter. The output from the lamp was calibrated using a silicon photodiode by the procedure outlined in Seaman, C. H. *Solar Energy* 1982, 29, 291-298 to simulate the AM1.5 condition (100 mW cm$^{-2}$).

Trilayer Strategy

Using the noted experimental setup, certain embodiments of the present invention were tested. There are 6 possible deposition orders that the binary sulfides can be deposited by the trilayer strategy:

A. substrate/SnS$_2$/Cu$_2$S/ZnS
B. substrate/SnS$_2$/ZnS/Cu$_2$S
C. substrate/ZnS/SnS$_2$/Cu$_2$S
D. substrate/ZnS/Cu$_2$S/SnS$_2$
E. substrate/Cu$_2$S/ZnS/SnS$_2$
F. substrate/Cu$_2$S/SnS$_2$/ZnS It has been discovered that only one of these ALD reaction sequences works for the binary processes to form the desired CZTS structure. Three failure modes were identified. The first is nucleation failure, which means a given binary metal sulfide does not grow to an appreciable extent on the layer deposited before it. The second failure mode is facile ion exchange between the film and the gas-phase precursor. For ion-exchange, one of the volatile chemical precursors reacts with the film already on the substrate to cause a bulk transformation in the preexisting thin film. It has previously been reported regarding two such ion exchange reactions relevant to the CZTS system, which were demonstrated by isolating the interaction between the organometallic precursor vapor and thin film:

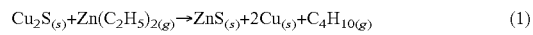

$$Cu_2S_{(s)}+Zn(C_2H_5)_{2(g)} \rightarrow ZnS_{(s)}+2Cu_{(s)}+C_4H_{10(g)} \quad (1)$$

$$ZnS_{(s)}+Cu_2DBA_{(g)} \rightarrow Cu_2S_{(g)}+ZnDBA_{(g)} \quad (2)$$

For reaction (1), the DEZ reacts with the Cu$_2$S to form ZnS, and the Cu$^+$ is reduced to Cu metal, and reaction (2), the ZnS reacts with the Cu$_2$ DBA, resulting in conversion to Cu$_2$S, and astonishingly, a complete removal of Zn$^{2+}$ from the film with no change in sulfur areal density. The third and final mode is stability failure that a given compound is unstable on a particular surface.

Nucleation failure occurred for the deposition of Cu$_2$S on substrates that had a preexisting SnS$_2$ film on them, where SnS$_2$ denotes a film formed by the SnTDMA/H$_2$S process, not necessarily the stoichiometry. This will be illustrated qualitatively by analyzing the XRF spectra presented in FIG. 1. The S$_{k\alpha}$ peak was present but has been omitted for clarity. Peaks at the energy of the Cu$_{k\alpha}$ and Cu$_{k\beta}$ lines were observed for 167 cycles of Cu$_2$S on a quartz substrate, as expected (FIG. 1). For the sequence quartz/800SnS$_2$/167Cu$_2$S/230ZnS, Sn and Zn were observed in the XRF spectra, but there was a conspicuous absence of Cu. Thus it can be said that the Cu$_2$S did not nucleate on the quartz/SnS$_2$ surface under these conditions. Therefore sequence (a) can be eliminated since the film contained no Cu$^+$ so CZTS formation was impossible. Sequence (c) fails by similar reasoning given the XRF spectra for quartz/230ZnS/800SnS$_2$/167Cu$_2$S (FIG. 1). It was expected that sequence (b) would fail by the ion exchange reaction (2), but in fact no copper was observed in the film. Therefore, given the absence of Cu in the XRF spectra for quartz/800SnS$_2$/230ZnS/167Cu$_2$S in FIG. 1, sequence (b) resulted in nucleation failure on the quartz/SnS$_2$/ZnS surface.

Figure 2:
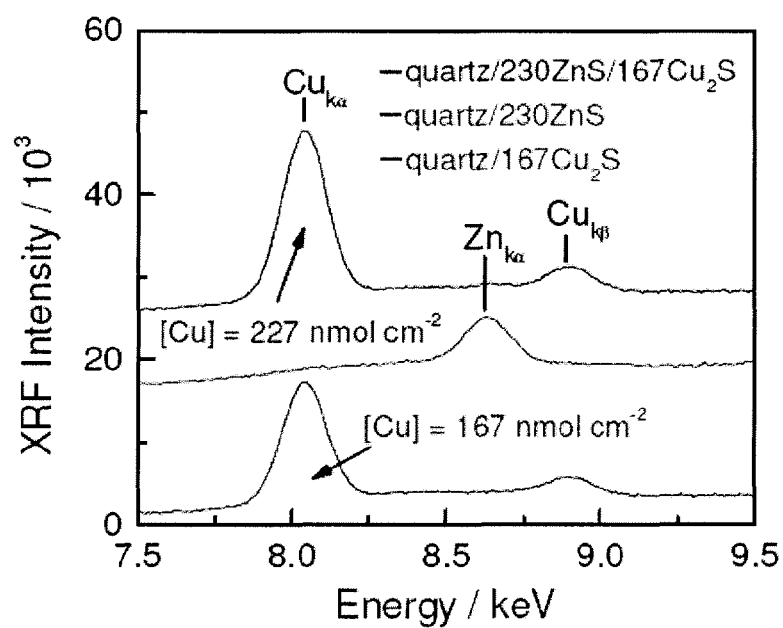
FIG. 2 is an XRF spectra showing ion exchange via reaction (2) would occur for sequence (d). The quartz/$Cu_2S$ and quartz/ZnS controls are included for reference. The plots have been offset for clarity.

Sequences (d) quartz/ZnS/Cu$_2$S/SnS$_2$ and (e) quartz/Cu$_2$S/ZnS/SnS$_2$ both failed by ion exchange via reactions (2) and (1) respectively. For sequence (d), the Zn$^{2+}$ was completely removed from the film after depositing the Cu$_2$S. This can be seen qualitatively in the XRF spectra of FIG. 2. After deposition of 167 cycles of $Cu_2S$ on the quartz/230ZnS surface, no Zn was observed by XRF in the sample. Furthermore, the area of the $Cu_{k\alpha}$ XRF peak in the quartz/230ZnS/167$Cu_2S$ sample was significantly larger than in the case of quartz/167$Cu_2S$, indicating more $Cu^+$ was added to the film than would be expected if only a $Cu_2S$ film were deposited. Thus given the present results and previous reported work, it is clear that sequence (d) fails by reaction (2).

Sequence (e) failed by the ion exchange reaction (1). This can be seen by examining the areal densities for Cu and Zn presented in Table 1. For a sample of sequence (e), the Zn areal density was more than 2 times larger than what would be expected based on the cycle numbers and ALD growth rate (Table 1), consistent with reaction (1). The Zn areal density for sequence (e) was higher than what would be expected based on the ion exchange with $Cu_2S$ and the deposition of a flat ZnS film. There was more Zn in the film because the surface area increased due to the violent nature of reaction (1), which caused delamination and increased the amount of ZnS deposited and therefore the areal density [Zn] measured by XRF.

One possibility considered with regard to the ion exchange reactions (1) and (2), is whether the reactions between the volatile precursor and preexisting thin film can be suppressed if a film of the second component (i.e. ZnS for reaction (1) or $Cu_2S$ for reaction (2)) is being deposited concurrently. Both FIG. 2 and Table 1 indicate the negative.

TABLE 1

Cu and Zn areal atomic densities showing the ion exchange reaction (1) occurred for sequence (e). The error is +/− 6.5%.

| Sample | [Cu] nmol cm$^{-2}$ | [Zn] nmol cm$^{-2}$ |
|---|---|---|
| quartz/167$Cu_2S$ | 167 | 0.0 |
| quartz/230ZnS | 0.0 | 93 |
| quartz/167$Cu_2S$/230ZnS/800$SnS_2$ | 161 | 211 |

Figure 3:
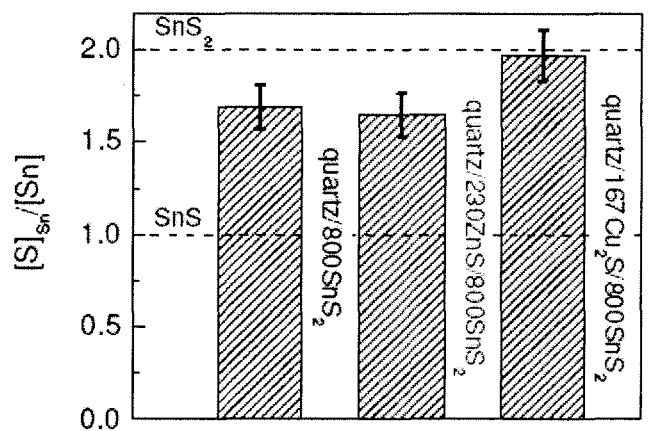
FIG. 3 is the areal atomic density ratio of sulfur associated with Sn calculated by equation (3) to Sn, for $SnS_2$ deposition on different surfaces.

The only remaining sequence is (f), and it will be shown that it works to obtain a composition controllable through the cycle ratios. In order to utilize an ALD process for the synthesis using sequence (f) $SnS_2$ is needed. However, an ALD process for $SnS_2$ has not been reported. One embodiment of the present invention includes a novel process for producing $SnS_2$ for use in ALD. A SnTDMA/$H_2S$ process provides viable $SnS_2$ for use in ALD processes. Initial observations indicate a dependence of the [S]/[Sn] ratio on the chemical composition of the substrate. Using the SnTDMA/$H_2S$ process, stoichiometric, crystalline $SnS_2$ could be deposited on quartz/$Cu_2S$; however, films deposited on quartz or quartz/ZnS were sulfur deficient. Plotted in FIG. 3 is the ratio of sulfur associated with Sn ([S]Sn) for $SnS_2$ films deposited on quartz, quartz/230ZnS and quartz/167$Cu_2S$. The value of [S]Sn was determined by the following equation:

$$[S]_{Sn} = [S]_{tot} - k[M]_i \quad (3)$$

where $[S]_{tot}$ is the total measured areal density of sulfur, $[M]i$ is the areal density of the other metal (either Cu or Zn), and k is the stoichiometric ratio of sulfur to metal in the other metal sulfide (k=0.5 for $Cu_2S$; and k=1 for ZnS).

Figure 4:
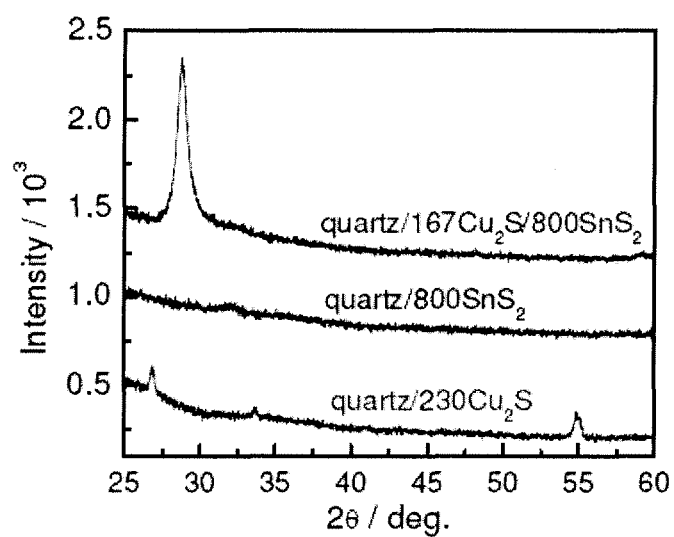
FIG. 4 are XRD patters for $SnS_2$ deposited on quartz alone and on a $Cu_2S$ layer on quartz. Also shown for clarity is an XRD pattern of the quartz/$Cu_2S$ film without $SnS_2$. The plots have been offset for clarity.
Figure 5:
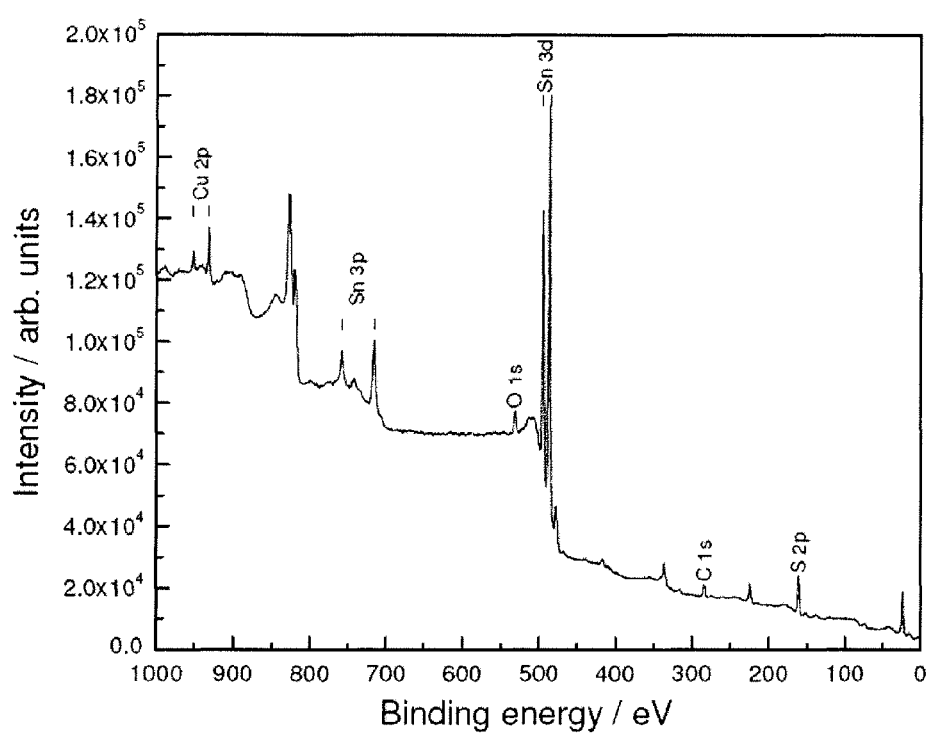
FIG. 5 is an XPS survey spectra used for quantification of the Cu atomic percentage (i.e. [Cu]/{[Cu]+[Sn]}) at the surface of the silicon/190$Cu_2S$/800$SnS_2$ sample.

It can be seen from FIG. 3, that only the $SnS_2$ deposited on $Cu_2S$ had an [S]Sn/[Sn] ratio of 2, while both of the others were sulfur deficient. XRD patterns are presented in FIG. 4. The quartz/230$Cu_2S$ sample exhibited peaks for the (002) and (004) reflections of hexagonal chalcocite, as expected for this ALD process. The quartz/800$SnS_2$ exhibited virtually no features in the XRD pattern, indicating that it contained a large amorphous fraction, likely caused by the sulfur deficiency illustrated in FIG. 3. The quartz/167$Cu_2S$/800$SnS_2$ exhibited a strong XRD peak for the (100) reflection of $SnS_2$. The peaks observed for $Cu_2S$ were absent from the quartz/167$Cu_2S$/800$SnS_2$ sample, which it is believed may be a result of extensive mixing between the phases. XPS measurements revealed significant copper content on the surface of the film for the case of as-deposited silicon/190$Cu_2S$/800$SnS_2$. The survey spectra used for quantification is presented in FIG. 5. The measurement probed only the near surface region, 1 to 3 nm away from the vacuum-film interface. The thickness of the $SnS_2$ layer based on the areal atomic density determined by XRF measurements was 46 nm. Cu+ diffused up through the $SnS_2$ layer to the surface of the film. Such facile Cu+ diffusion in $SnS_2$ has been observed previously, and is consistent with the disappearance of the $Cu_2S$ peaks in the XRD spectrum for the 167$Cu_2S$/800$SnS_2$ bilayer (FIG. 4). For the surface of the film, the Cu atomic concentration based on Sn was estimated to be 10% by the standard CasaXPS procedure using core level Cu 2p and Sn 3d lines.

Figure 6:
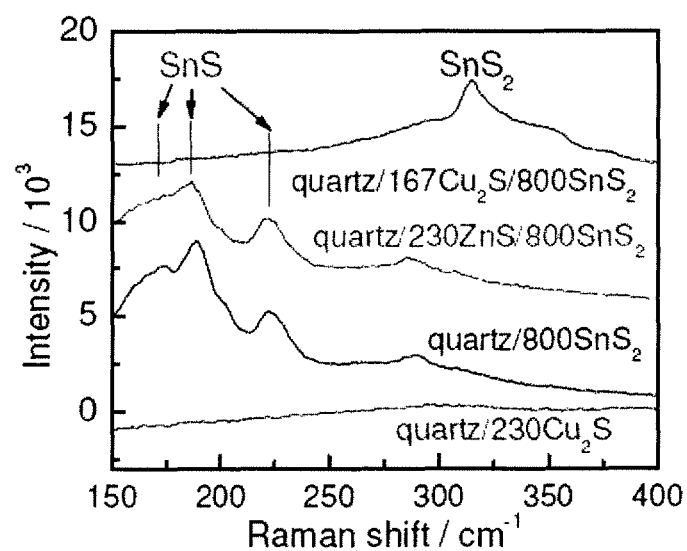
FIG. 6 is a Raman scattering spectra for $SnS_2$ deposited on quartz, quartz/ZnS and quartz/$Cu_2S$. The peak at 288 $cm^{-1}$ in the black and blue curves can also be assigned to SnS. The quartz/$Cu_2S$ control is included for reference. The plots have been offset for clarity.

While XRD demonstrates crystallinity, many of the binary and ternary metal sulfides in the Cu—Zn—Sn—S system have reflections at nominally the same angles (such as 2θ≈28.5), often rendering XRD results ambiguous. Raman scattering is a more conclusive characterization technique for the CZTS system, despite the drawback of no centralized, vetted database for peak assignments. The Raman scattering spectra of quartz/230$Cu_2S$, quartz/800$SnS_2$, quartz/230ZnS/800$SnS_2$ and quartz/167$Cu_2S$/800$SnS_2$ are plotted in FIG. 6. The quartz/230$Cu_2S$ sample was featureless in the spectral range of interest. The quartz/800$SnS_2$ exhibited a broad peak centered at approximately 173 cm$^{-1}$ and two sharper peaks at 189 cm$^{-1}$ and 221 cm$^{-1}$. These peaks, as well as the small peak at 288 cm$^{-1}$, can be reasonably assigned to SnS. The Raman scattering spectra of the quartz/230ZnS/800$SnS_2$ sample was similar to the $SnS_2$ on quartz. Considering that [S]Sn/[Sn]>>1.0 (FIG. 3) for these samples, the $SnS_2$ deposited on quartz and quartz/ZnS was likely a mixture of SnS and amorphous $SnS_2$. The quartz/167$Cu_2S$/800$SnS_2$ sample exhibited a sharp peak at 313 cm$^{-1}$, consistent with $SnS_2$. The shoulders to either side of the $SnS_2$ peak could be assigned to $Cu_2SnS_3$, although the one on the low wavenumber side had a low intensity. The conclusion is that the $Cu_2S$ is needed to stabilize the $SnS_2$, and therefore this layer is described as copper-stabilized tin disulfide.

Figure 7:
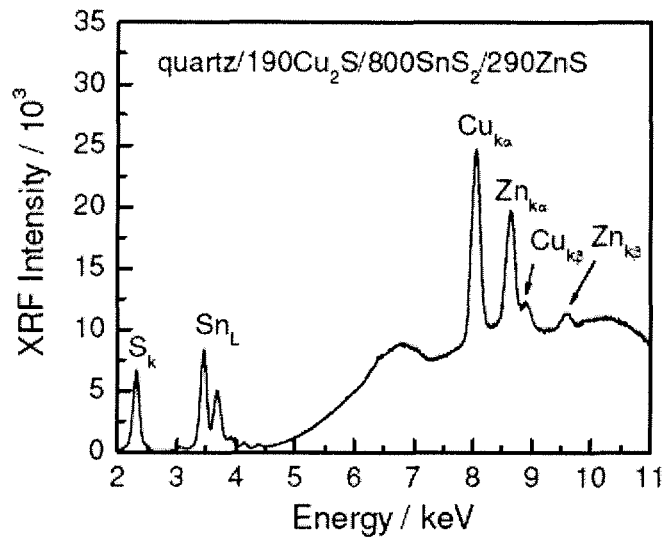
FIG. 7 is an XRF spectrum for a trilayer deposited on quartz using sequence (f).

Sequence (f) was successful in depositing each of the metal sulfides with the target stoichiometry, and the metal ratios were controlled by the cycle ratios for each process. Plotted in FIG. 7 is an XRF spectrum for a quartz/190$Cu_2S$/800$SnS_2$/290ZnS trilayer. All four elements were clearly present. The areal densities for various films are presented in Table 2. The error associated with each value was a result of the background subtraction prior to peak integration. All of the samples exhibited [Metal]/[S] ratios expected for the oxidation states: Cu(+I), Zn(+II), Sn(+IV) and S(−II). Samples were deposited with different cycle numbers and different cycle ratios, but the growth per cycle for each of the binary components was unaffected, meaning the cycle number for each component was much larger than the nucleation delay. If a large decrease in the cycle number were made such that it was no longer much greater than the nucleation delay, a significantly smaller average growth per cycle would be expected. For the samples containing copper, the $Cu_2S$ growth per cycle was the same within the experimental error of XRF and the average was equal to 0.49 nmol cm$^{-2}$ cycle$^{-1}$. Similarly, all of the samples containing Zn exhibited the same growth per cycle of 0.40 nmol cm$^{-2}$ cycle$^{-1}$, demonstrating that ZnS growth on Cu$_2$S/SnS$_2$ was virtually identical to that on quartz. The SnS$_2$ showed an average growth per cycle of 0.14 nmol cm$^{-2}$ cycle$^{-1}$ under these conditions.

Figure 8:
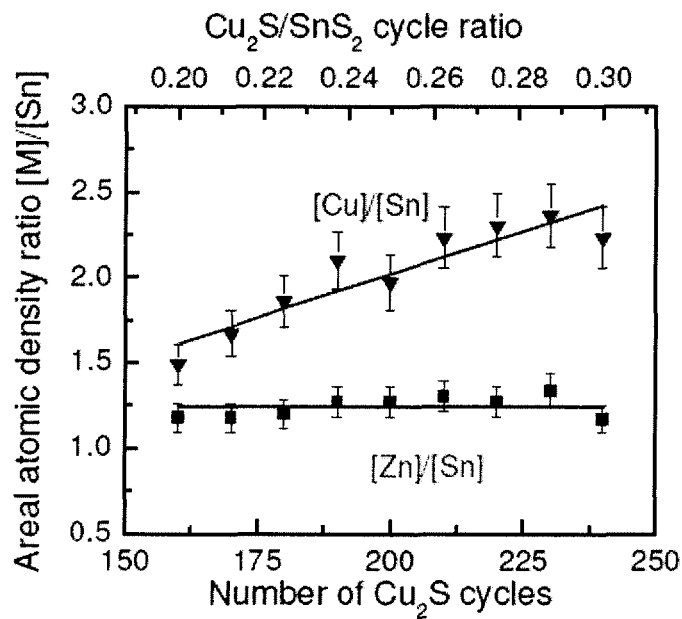
FIG. 8 is an areal atomic density ratio as a function of $Cu_2S$ cycle number for a constant 800 $SnS_2$ cycles and constant 290 ZnS cycles.

Since the oxidation states were the target ones for CZTS, and the growth per cycle of the binary components was constant, the cycle numbers could be tuned to adjust the metal ratios. The general process for synthesis of a chalcogenides is n(xCu$_2$S/ySnS$_2$/zZnS). In certain implementations, the content of copper could be increased by increasing the value of x for given constant values of y and z. The content of copper could be deceased by decreasing the value of x for given constant values of y and z. A similar strategy could be used to increase or decrease the content of zinc or tin. That is, to adjust tin, adjust y for given x and z; and to adjust zinc, adjust z for given x and y. This can be seen first by examining the last two samples in Table 2. For the cycle ratios Cu$_2$S/SnS$_2$=0.209 and ZnS/SnS$_2$=0.288, [Cu]/[Sn]=1.45 and [Zn]/[Sn]=0.87. To get closer to the metal ratios often used for CZTS absorbers in photovoltaic thin film solar cells, using Cu$_2$S/SnS$_2$=0.238 and ZnS/SnS$_2$=0.363 results in a [Cu]/[Sn]=1.88 and [Zn]/[Sn]=1.16. Plotted in FIG. 8 is the measured [Cu]/[Sn] areal atomic density ratio for different Cu$_2$S/SnS$_2$ cycle ratios at constant ZnS/SnS$_2$=0.363 and constant 800 SnS$_2$ cycles. As expected, the areal atomic density ratio [Zn]/[Sn] remained constant, and [Cu]/[Sn] increased with increasing Cu$_2$S/SnS$_2$ cycle ratio. Therefore, it has been demonstrated that the trilayer strategy using sequence (f) was effective to place the metal and sulfur atoms on the substrate in the correct oxidization state, and the metal ratios could be controlled using the ratios of the number of cycles for each binary process.

| Areal Densities/nmol cm−2 (error is ± 6.5% of value) | | | | |
|---|---|---|---|---|
| Sample | [Cu] | [Zn] | [Sn] | [S] |
| 167Cu$_2$S | 167 | — | — | 82 |
| 167Cu$_2$S/800SnS$_2$ | 159 | — | 117 | 309 |
| 230ZnS | — | 93 | — | 93 |
| 167Cu$_2$S/800SnS$_2$/230ZnS | 152 | 91 | 105 | 379 |
| 190Cu$_2$S/800SnS$_2$/290ZnS | 190 | 117 | 101 | 400 |

Figure 9:
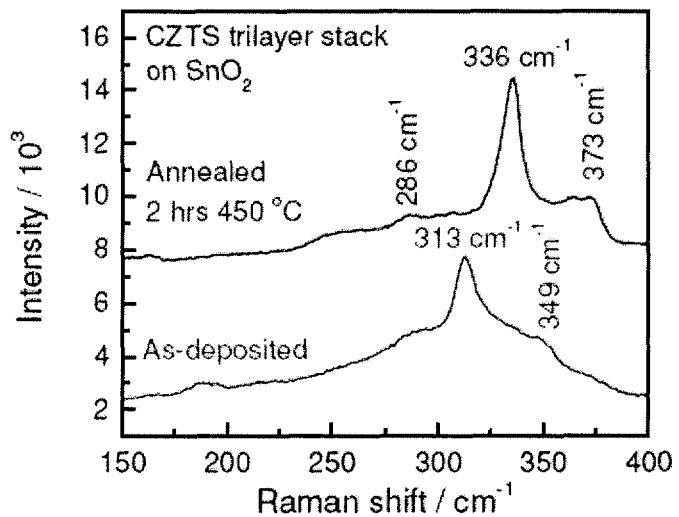
FIG. 9 is a Raman scattering spectra for a 190$Cu_2S$/800$SnS_2$/290ZnS trilayer on FTO before and after annealing at 450° C. in Ar for 2 hours. The plots have been offset for clarity.

The trilayer strategy is effective for placing the metal and sulfur atoms on the substrate, but as-deposited the elements are not mixed or crystallized. In one embodiment, crystallization of the CZTS can be accomplished by a thermal treatment of the as-deposited Cu$_2$S/SnS$_2$/ZnS trilayer. In one implementation, the annealing both mixes and crystallizes the materials. If the plotted in FIG. 9 are the Raman spectra of a 190Cu$_2$S/800SnS$_2$/290ZnS trilayer before and after annealing for 2 hours at 450° C. in argon. As deposited, the trilayer exhibited a prominent peak at 313 cm$^{-1}$ that was assigned to SnS$_2$, and a well-defined shoulder at 349 cm$^{-1}$ consistent with Cu$_2$SnS3. After annealing in Ar at 450° C. for 2 hours, the main peak shifted to 336 cm$^{-1}$ and the shoulder shifted to 373 cm$^{-1}$, consistent with the formation of CZTS.

Figure 10:
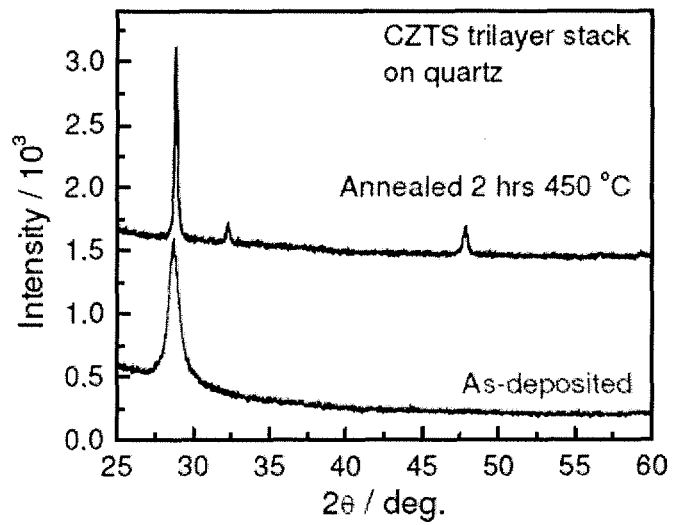
FIG. 10 are XRD patters for quartz/190$Cu_2S$/800$SnS_2$/290ZnS trilayer before and after annealing at 450° C. in Ar for 2 hours. The plots have been offset for clarity.
Figure 11:
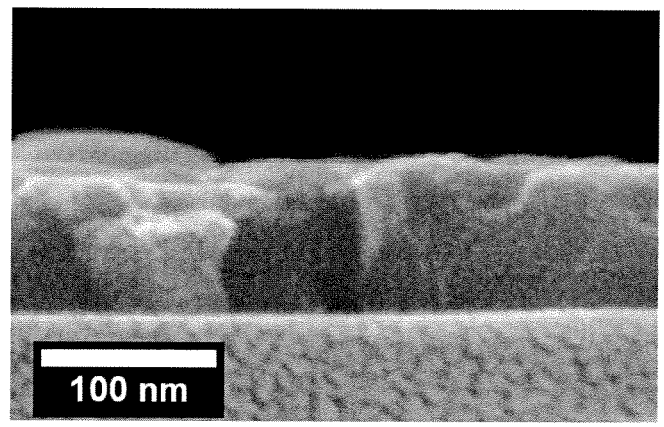
FIG. 11 is a cross sectional SEM image of a quartz/190$Cu_2S$/800$SnS_2$/290ZnS trilayer after annealing at 450° C. for 1 hour in Ar. The sample was coated with a thin layer of Au before imaging. The three visible regions, from bottom to top, are the substrate, CZTS film and vacuum.

The Raman spectra in FIG. 9 for the annealed sample closely resembles that previously found for a non-ALD Cu$_2$ZnSnS$_4$ film that achieved a power conversion efficiency of 7.3% for photovoltaic solar cells. The XRD pattern for the same 90 Cu$_2$S/800SnS$_2$/290ZnS trilayer before and after annealing is plotted in FIG. 10. As deposited, the XRD pattern was consistent with the (100) reflection at 28.3o of SnS$_2$ observed for quartz/Cu$_2$S/SnS$_2$ (FIG. 4). After annealing the peaks become sharper, and in addition to the prominent peak for the (112) reflection of CZTS at 28.5, small peaks for the (200) and (220) reflections of this phase also become visible. A cross-sectional SEM image of a 190Cu$_2$S/800SnS$_2$/290ZnS trilayer sample on quartz after annealing is shown in FIG. 11. The film was compact, continuous and 90 nm in thickness.

Figure 12:
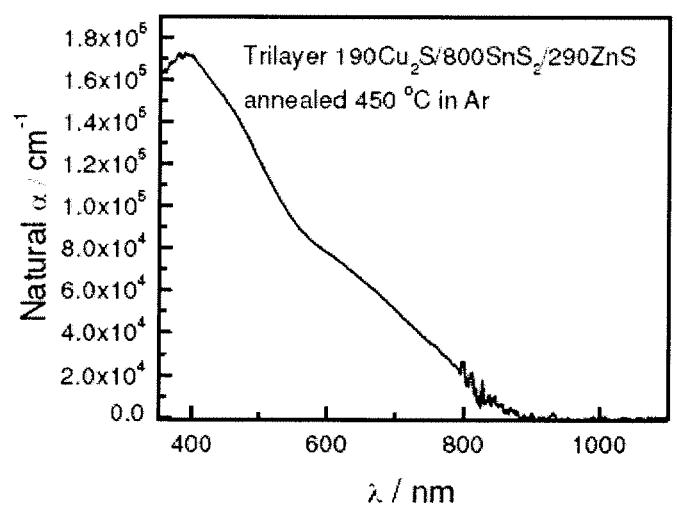
FIG. 12 is an absorption coefficient measured from a 90 nm 190 $Cu_2S$/800$SnS_2$/290ZnS CZTS film.

The absorption coefficient, calculated using the equation α=−ln [T/(1−R)]/d where T is the transmittance, R is the reflectance and d is the film thickness, is plotted in FIG. 12. The absorption onset was approximately 895 nm, consistent with Eg=1.4 eV. The XRF spectra showed a slight decrease in [S] after annealing for 3 hours at 450° C. in Ar, but the 1 standard deviation confidence intervals before and after annealing overlapped, so the difference was insignificant.

Figure 13:
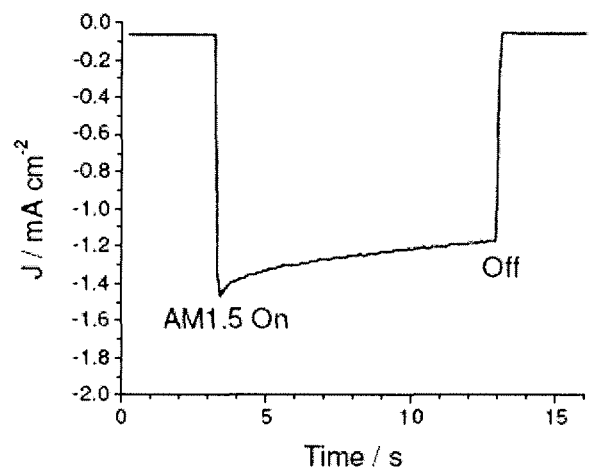
FIG. 13 Photocurrent measured in a 0.1M $Eu^{3+}$ with 1M KCl electrolyte at an applied potential of −0.6 V vs. Ag/AgCl. The film was a trilayer of 190$Cu_2S$/800$SnS_2$/290ZnS on FTO annealed for 1 hour in Ar at 450° C.
Figure 17:
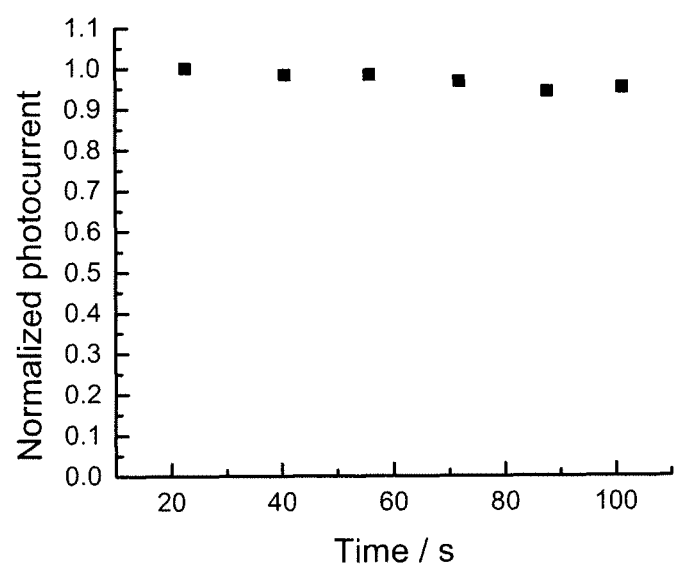
FIG. 17 is a graph of normalized photocurrent as a function of time in the $Eu^{3+}$ electrolyte. The light pulses were approximately 6 seconds on and 10 seconds off. The difference between the photocurrent at the end of the light pulse and the dark current immediately after the light pulse is plotted, normalized by the maximum value.

After annealing, the CZTS was photoactive, that is it has been observed to produce photocurrent with a reasonable internal quantum efficiency. Plotted in FIG. 13 is the photocurrent density of a CZTS film annealed in argon at 450° C. for 1 hour. The electrolyte contained 0.1M Eu$^{3+}$ as an electron acceptor and 1M KCl supporting electrolyte. The area exposed to the electrolyte was 1.7 cm$^2$. FIG. 13 was measured at an applied potential of −0.6 V vs. Ag/AgCl. Before illumination, very little dark current was measured ($J_{dark}$=−0.06 µA cm$^{-2}$). After opening the shutter to illuminate the film through the semiconductor-electrolyte interface, a large decrease in current to −1.4 mA cm$^{-2}$ was observed, consistent with the expected behavior of a p-type photocathode. The photocurrent magnitude decreased slightly with time under illumination. For subsequent light pulses, the initial photocurrent was higher in magnitude than the last photocurrent measurement of the previous pulse (data not shown here), indicating that the 20% decrease in photocurrent in FIG. 13 could have been due to consumption of the Eu$^{3+}$ in the near surface region under illumination. In the dark, the Eu$^{3+}$ concentration in the near surface region increased as it was replenished. Over longer time scales, the photocurrent magnitude at the end of subsequent pulses decreased slightly with time. Plotted in FIG. 17 is the normalized photocurrent at the end of a 6 second light pulse minus the dark current immediately after. The time between light pulses was approximately 10s. It can be seen from FIG. 17 that over the course of the 100 second experiment, the photocurrent magnitude decreased by approximately 6%, indicating that the CZTS film was slightly unstable under these reducing conditions in the aqueous electrolyte. While the aqueous electrolyte is sufficient to demonstrate photoactivity, clearly an operating device would require and all solid state configuration. The theoretical maximum AM1.5 photocurrent from a semiconductor with a 1.4 eV band gap is 33 mA cm$^{-2}$. The absorption depth from the annealed trilayer in FIG. 12 at 850 nm was 1.69 µm, much greater than the film thickness of 0.09 µm. When the absorption efficiency spectra (i.e. a=1−T−R) for the film in FIG. 13 was integrated over the AM1.5 spectra, the maximum theoretical photocurrent was −12.1 mA cm$^{-2}$. Since the initial photocurrent was approximately −1.4 mA cm$^{-2}$, the average internal quantum efficiency was approximately 12%. The external quantum efficiency spectra (i.e., incident photon to current efficiency, or IPCE) was not measured because of the photocurrent instability illustrated in FIG. 13. Wavelengths measured at later times would be biased towards smaller values compared to the wavelengths measured first, therefore distorting the spectra.

The photoactivity of CZTS is strongly dependent on the annealing conditions and photoelectrochemistry depends on the surface. For instance, it has been reported that Cu$_2$ZnSnS$_4$ decomposes via a first order reaction into Cu$_2$S+ZnS+SnS+S, where the SnS and S are both potentially volatile depending on the temperature. Even though the metal and sulfur ratios may be correct for the present films, annealing in Ar might have partially decomposed the material thereby inhibiting activity. Therefore, in one embodiment the annealing is not done in the presence of Ar. Optimizing the annealing temperature and including SnS or S in the furnace has been shown on other samples to increase the performance. In certain implementations, the reaction environment is an inert gas (such as $N_2$, He, Ne, Ar), air, hydrogen mixtures (such as diluted or pure hydrogen), and gaseous environments that contain any of the following: sulfur (S), selenium (Se) tin sulfide (SnS or $SnS_2$), tin selenide (SnSe or $SnS_2$), germanium sulfide ($GeS_2$ or GeS) and germanium selenide ($GeSe_2$ or GeSe).

Supercycle

In contrast to the trilayer embodiment, the supercycle embodiment bears more resemblance to the conventional procedure to synthesize nanolaminates and nanoalloys by atomic layer deposition. In the supercycle strategy, instead of depositing 3 thick binary layers and then mixing them, many thinner layers are deposited in sequence and therefore the film should start off better mixed and require less annealing to form the CZTS. Thus, generally for the supercycle strategy, the x, y, and z in the process scheme will be smaller than in the trilayer process, but the number of sequences (that is, n in the process scheme) will be greater than 1. For embodiments of the trilayer process based on sequence (f) $190Cu_2S/800SnS_2/290ZnS$, an analogous supercycle process would be $10(19Cu_2S/80SnS_2/29ZnS)$. That is, repeating the process $19Cu_2S/80SnS_2/23ZnS$ 10 times in sequence. Raman spectra for an as-deposited supercycle film of the process $10(19Cu_2S/80SnS_2/29ZnS)$, as well as $190Cu_2S/800SnS_2/290ZnS$ before and after annealing, are presented in FIG. 14. The as-deposited supercycle film exhibited a Raman scattering spectra very similar to the annealed CZTS, except that the peaks were much lower intensity and wider, as one would expect for a material with very small nanometer sized grains.

Figure 14:
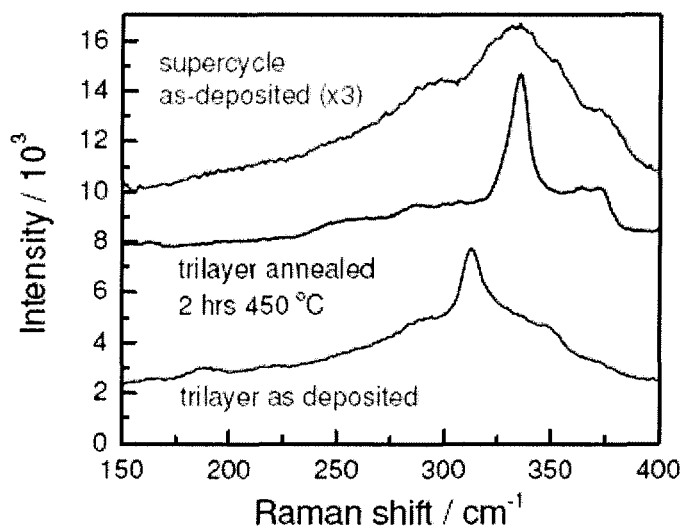
FIG. 14 is a Raman spectra of a 190 $Cu_2S$/800$SnS_2$/290ZnS trilayer film before and after annealing in Ar and a supercycle film of 10(19$Cu_2S$/80$SnS_2$/29ZnS) as deposited. The plots have been offset for clarity.
Figure 15:
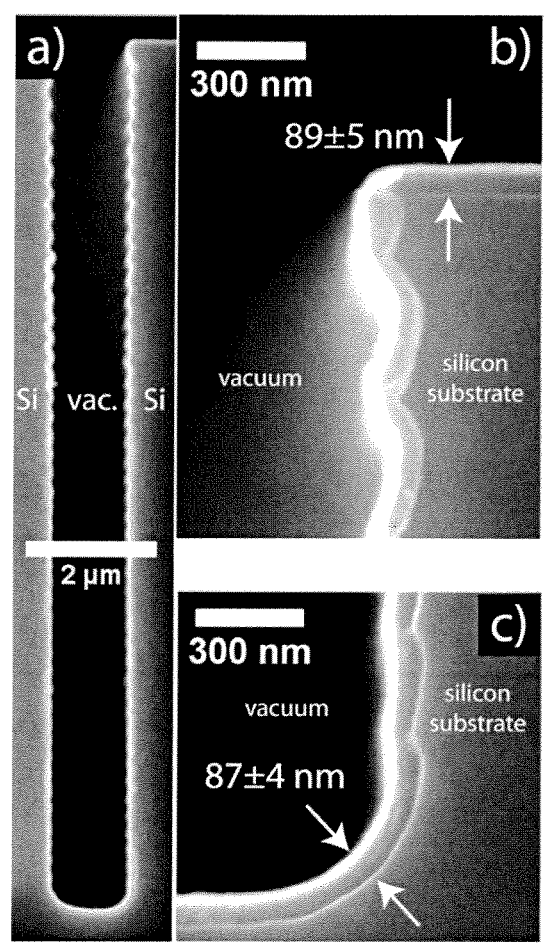
FIGS. 15A-C are a SEM images illustrating the Cu—Zn—Sn—S conformal layer on a silicon wafer trench.

The film thickness, however, was substantially reduced. This can be seen in Table 3, where the areal densities of each atom were reduced by a factor of ~4 in the supercycle film compared to the trilayer film, despite the same total number of cycles of each binary process. This indicates that each layer had a nucleation delay, and so the average growth per cycle from the trilayer films cannot necessarily be used to predict the growth per cycle of the supercycle film. The measured sulfur areal density of $182\pm12$ nmol $cm^{-2}$ for the $10(19Cu_2S/80SnS_2/29ZnS)$ supercycle film is not statistically significantly less than the expected amount if all of the metals were in their target oxidation states, which would be $213\pm24$ nmol $cm^{-2}$, given the uncertainty in the areal density of each metal. The metal ratios, however, are different from the trilayer film. For the $190Cu_2S/800SnS_2/290ZnS$ trilayer film, [Cu]/[Sn]=1.88 and [Zn]/[Sn]=1.16; while for the $10(19Cu_2S/80SnS_2/29ZnS)$ film, [Cu]/[Sn]=0.96 and [Zn]/[Sn]=0.52. In both cases the [Cu]/[Zn] ratios are similar, $1.62\pm0.15$ in the trilayer case and $1.84\pm0.15$ in the supercycle case. When a supercycle film was deposited using the process $10(19Cu_2S/40SnS_2/31ZnS)$, then the measured [S]=$56\pm0.15$ nmol $cm^{-2}$ was much less than the expected sulfur concentration of $119\pm13$ nmol $cm^{-2}$ if all of the metals were in their target oxidation states. The films also became delaminated in some places. Thus 40 cycles of $SnS_2$ seems insufficient to prevent ion exchange and reduction of the film, most likely caused by DEZ. The Raman scattering spectra for the as-deposited supercycle film presented in FIG. 14 is encouraging. Thus, one embodiment of the present invention relates to a low temperature route for CZTS crystalline synthesis, with an adjusted pulse sequence to produce the correct composition if nucleation behavior for each binary process was mapped out in detail, since the rule of mixtures clearly does not apply to this system.

Figure 16:
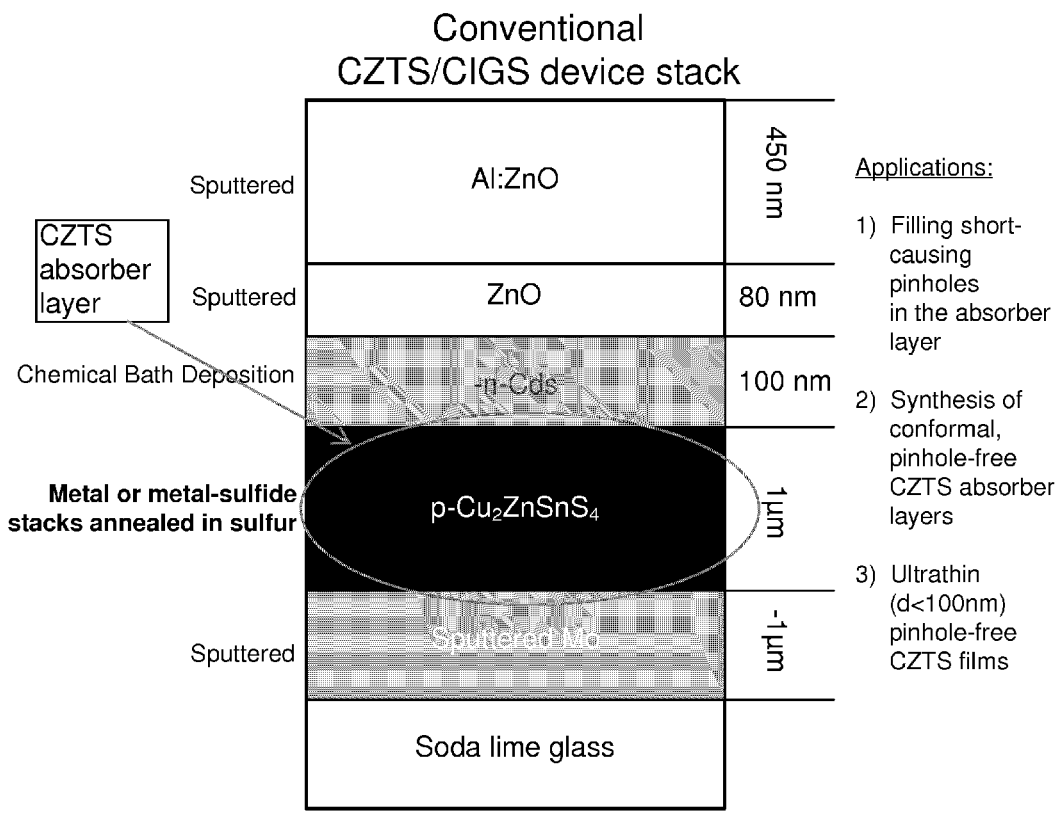
FIG. 16 illustrates an embodiment of the present invention utilizing CZTS in a device stack for photovoltaics.

In one embodiment, the ALD methods of the present invention may be used in the creation of a device, such as for photovoltaic applications. FIG. 16 illustrates a "conventional" CZTS/CIGS device stack, where the CZTS layer may be deposited through use of the methods described above rather than the methods previously used (as described in the Background) to achieve improved results.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of synthesizing a $Cu_2ZnSnS_4$ conformal layer, comprising the steps of:
   depositing, via atomic layer deposition, a $Cu_2S$ layer;
   depositing, via atomic layer deposition, a $SnS_2$ layer on the $Cu_2S$ layer; and
   depositing, via atomic layer deposition, a ZnS layer on the $SnS_2$ layer;
   forming $Cu_2ZnSnS_4$ from the $Cu_2S$ layer, the ZnS layer, and the $SnS_2$ layer.

2. The method of claim 1, further comprising annealing the $Cu_2S$ layer, $SnS_2$ layer, and ZnS layer to form $Cu_2ZnSnS_4$.

3. The method of claim 1, wherein the depositing of the $Cu_2S$ layer, the $SnS_2$ layer, and the ZnS layer comprise the creation of a stack and further comprising the creation of a plurality of stacks.

4. The method of claim 1, wherein an atomic layer deposition cycle for depositing $Cu_2S$ via atomic layer deposition comprises the steps of:
   exposing the substrate to a fluid containing a gaseous copper-containing precursor;
   purging the gaseous copper-containing precursor;
   exposing the substrate to a fluid containing a gaseous sulfur-containing precursor; and
   purging the gaseous sulfur-containing precursor.

5. The method of claim 1, wherein an ALD cycle for depositing $SnS_2$ via atomic layer deposition comprises the steps of:
   exposing the substrate to a fluid containing a gaseous tin-containing precursor;
   purging the gaseous tin-containing precursor;
   exposing the substrate to a fluid containing a gaseous sulfur-containing precursor; and
   purging the gaseous sulfur-containing precursor.

6. The method of claim 1, wherein an atomic layer deposition cycle for depositing ZnS via atomic layer deposition comprises the steps of:
   exposing the substrate to a fluid containing a gaseous zinc-containing precursor;
   purging the gaseous zinc-containing precursor;
   exposing the substrate to a fluid containing a gaseous sulfur-containing precursor; and
   purging the gaseous zinc-containing precursor.

7. The method of claim 1 wherein the forming occurs via temporal atomic layer deposition.

8. The method of claim 1 wherein the forming occurs via spatial atomic layer deposition.

9. A method of synthesizing a $Cu_2ZnSnS_4$ conformal layer, comprising the steps of:
  creating N $Cu_2S/SnS_2/ZnS$ stacks by:
    depositing via X number of cycles of atomic layer deposition $Cu_2S$;
    depositing via Y number of cycles of atomic layer deposition $SnS_2$; and
    depositing via Z number of cycles of atomic layer deposition ZnS.

10. The method of claim 9, wherein X is greater than or equal to 1.

11. The method of claim 9 wherein Y is greater than or equal to 1.

12. The method of claim 9 wherein Z is greater than or equal to 1.

13. The method of claim 9, wherein N is 1.

14. The method of claim 9, wherein N is greater than 1.

15. A method of synthesizing chalcogenides comprising steps of:
  creating n first sulfide/second sulfide/third sulfide stacks by:
    depositing, via x number of cycles of atomic layer deposition, a first sulfide layer;
    depositing, via y number of cycles of atomic layer deposition, a $SnS_2$ layer; and
    depositing, via z number of cycles of atomic layer deposition, a third sulfide layer.

16. The method of claim 15, wherein n is one and further comprising mixing the first sulfide layer, the $SnS_2$ layer, and the third sulfide layer.

17. The method of claim 15, wherein n is greater than one.

18. A method of depositing $SnS_2$ on a substrate, comprising the steps of:
  exposing the substrate to tetrakis(dimethylamido)Sn(IV) for about 1 second, then;
  purging for about 20 seconds with an inert gas, then;
  exposing the substrate to a $H_2S$ for about 1s; and
  purging for about 20 seconds with nitrogen.

* * * * *